(12) United States Patent
Agarwal et al.

(10) Patent No.: US 10,727,204 B2
(45) Date of Patent: Jul. 28, 2020

(54) DIE STACKING FOR MULTI-TIER 3D INTEGRATION

(71) Applicants: Rahul Agarwal, Livermore, CA (US); Milind S. Bhagavat, Los Altos, CA (US)

(72) Inventors: Rahul Agarwal, Livermore, CA (US); Milind S. Bhagavat, Los Altos, CA (US)

(73) Assignee: Advances Micro Devices, Inc., Santa Clara, CA (US)

(*) Notice: Subject to any disclaimer, the term of this patent is extended or adjusted under 35 U.S.C. 154(b) by 0 days.

(21) Appl. No.: 15/991,573

(22) Filed: May 29, 2018

(65) Prior Publication Data

US 2019/0371763 A1 Dec. 5, 2019

(51) Int. Cl.
*H01L 25/065* (2006.01)
*H01L 25/00* (2006.01)
(Continued)

(52) U.S. Cl.
CPC .......... *H01L 25/0657* (2013.01); *H01L 21/78* (2013.01); *H01L 24/08* (2013.01); *H01L 24/80* (2013.01); *H01L 25/50* (2013.01); *H01L 2224/08145* (2013.01); *H01L 2224/80895* (2013.01); *H01L 2224/80896* (2013.01); *H01L 2225/06524* (2013.01); *H01L 2225/06541* (2013.01); *H01L 2225/06586* (2013.01); *H01L 2225/06589* (2013.01)

(58) Field of Classification Search
CPC ......... H01L 21/78; H01L 24/08; H01L 24/80; H01L 25/0657; H01L 25/50
See application file for complete search history.

(56) References Cited

U.S. PATENT DOCUMENTS

| | | |
|---|---|---|
| 5,901,041 A | 5/1999 | Davies et al. |
| 6,589,802 B1 | 7/2003 | Asada et al. |

(Continued)

FOREIGN PATENT DOCUMENTS

| | | |
|---|---|---|
| JP | 05160296 | 6/1993 |
| JP | 11265909 | 9/1999 |

(Continued)

OTHER PUBLICATIONS

PCT/US2019/024835 International Search Report & Written Opinion dated Aug. 9, 2019.

(Continued)

*Primary Examiner* — Andrew Q Tran
(74) *Attorney, Agent, or Firm* — Timothy M. Honeycutt

(57) ABSTRACT

Various die stacks and methods of creating the same are disclosed. In one aspect, a method of manufacturing is provided that includes mounting a first semiconductor die on a second semiconductor die of a first semiconductor wafer. The second semiconductor die is singulated from the first semiconductor wafer to yield a first die stack. The second semiconductor die of the first die stack is mounted on a third semiconductor die of a second semiconductor wafer. The third semiconductor die is singulated from the second semiconductor wafer to yield a second die stack. The second die stack is mounted on a fourth semiconductor die of a third semiconductor wafer.

21 Claims, 9 Drawing Sheets

(51) Int. Cl.
*H01L 23/00* (2006.01)
*H01L 21/78* (2006.01)

(56) References Cited

U.S. PATENT DOCUMENTS

| | | | |
|---|---|---|---|
| 6,977,686 B2 | 12/2005 | Shinomiya et al. | |
| 7,198,980 B2 | 4/2007 | Jiang et al. | |
| 7,459,774 B2 * | 12/2008 | Kwon | H01L 21/76898 257/686 |
| 7,915,720 B2 | 3/2011 | Tashiro et al. | |
| 8,372,741 B1 | 2/2013 | Co et al. | |
| 8,691,626 B2 | 4/2014 | Su et al. | |
| 8,842,945 B2 | 9/2014 | Nguyen et al. | |
| 9,214,454 B2 | 12/2015 | Haba et al. | |
| 9,245,771 B2 * | 1/2016 | Chung | H01L 21/561 |
| 9,312,198 B2 | 4/2016 | Meyer et al. | |
| 9,412,675 B2 * | 8/2016 | Gandhi | H01L 23/4012 |
| 9,502,390 B2 | 11/2016 | Caskey et al. | |
| 9,520,333 B1 | 12/2016 | Shih et al. | |
| 9,601,461 B2 | 3/2017 | Ho et al. | |
| 9,620,464 B2 | 4/2017 | Baks et al. | |
| 9,768,105 B2 | 9/2017 | Lii et al. | |
| 9,780,079 B2 | 10/2017 | Li et al. | |
| 9,806,014 B2 | 10/2017 | Alfano et al. | |
| 9,812,429 B2 | 11/2017 | Das et al. | |
| 9,818,697 B2 | 11/2017 | Lin et al. | |
| 9,859,191 B2 | 1/2018 | Lee et al. | |
| 9,893,036 B2 | 2/2018 | Ogiso et al. | |
| 9,966,325 B2 | 5/2018 | Beyne | |
| 9,972,611 B2 | 5/2018 | Pappu et al. | |
| 2001/0050441 A1 | 12/2001 | Shivkumar et al. | |
| 2003/0209837 A1 | 11/2003 | Farnworth | |
| 2004/0124513 A1 | 7/2004 | Ho et al. | |
| 2005/0167798 A1 | 8/2005 | Doan | |
| 2006/0207789 A1 | 9/2006 | Soeta | |
| 2007/0045836 A1 | 3/2007 | Kwon et al. | |
| 2007/0205501 A1 | 9/2007 | Lee et al. | |
| 2007/0218678 A1 | 9/2007 | Suh et al. | |
| 2008/0081401 A1 | 4/2008 | Shizuno | |
| 2014/0377909 A1 | 12/2014 | Chung et al. | |
| 2015/0311182 A1 | 10/2015 | Lee et al. | |
| 2016/0351540 A1 | 12/2016 | Ogiso et al. | |
| 2018/0040592 A1 | 2/2018 | Gandhi et al. | |
| 2018/0130772 A1 | 5/2018 | Yu et al. | |

FOREIGN PATENT DOCUMENTS

| | | |
|---|---|---|
| JP | 2000311905 | 11/2000 |
| JP | 2000357768 | 12/2000 |
| JP | 2009158623 | 7/2009 |
| KR | 1020110044963 | 5/2011 |
| KR | 1020140112674 | 9/2014 |

OTHER PUBLICATIONS

PCT/US2011/051075 International Search Report dated Dec. 27, 2011.

Sandeep Kumar Samal et al.; *Adaptive Regression-Based Thermal Modeling and Optimization for Monolithic 3-D ICs*; IEEE Transactions on Computer-Aided Design of Integrated Circuits and Systems; vol. 35; No. 10; Oct. 2016; pp. 1707-1720.

* cited by examiner

DIE STACKING FOR MULTI-TIER 3D INTEGRATION

BACKGROUND OF THE INVENTION

Many current integrated circuits are formed as multiple dies on a common wafer. After the basic process steps to form the circuits on the dies are complete, the individual dies are singulated from the wafer. The singulated dies are then usually mounted to structures, such as circuit boards, or packaged in some form of enclosure.

One frequently-used package consists of a substrate upon which a die is mounted. The upper surface of the substrate includes electrical interconnects. The die is manufactured with a plurality of bond pads. A collection of solder joints are provided between the bond pads of the die and the substrate interconnects to establish ohmic contact. After the die is mounted to the substrate, a lid is attached to the substrate to cover the die. Some conventional integrated circuits, such as microprocessors, generate sizeable quantities of heat that must be transferred away to avoid device shutdown or damage. The lid serves as both a protective cover and a heat transfer pathway.

Stacked dies arrangements involve placing or stacking one or more semiconductor dies on a base semiconductor chip. In some conventional variants, the base semiconductor die is a high heat dissipating device, such as a microprocessor. The stacked dies are sometimes memory devices. In a typical conventional manufacturing process the dies are stacked one at a time on the base die. Die-to-die electrical connections are by way of bumps and through-chip-vias.

BRIEF DESCRIPTION OF THE DRAWINGS

The foregoing and other advantages of the invention will become apparent upon reading the following detailed description and upon reference to the drawings in which.

DETAILED DESCRIPTION

Figure 1:
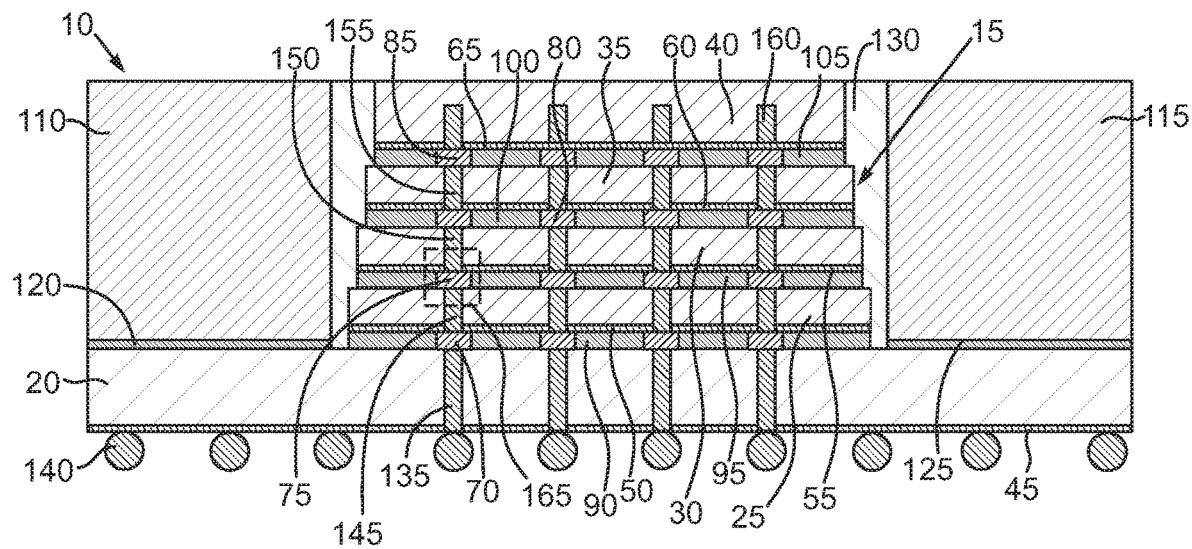
FIG. 1 is a sectional view of an exemplary arrangement of a semiconductor die device with die stacking.

A conventional die stacking technique stacks dies sequentially, one die on top of the first die and so on up to the top die of the stack. Where through-die-vias (TDVs) are used for die to die electrical connections, a reveal process is necessary to reveal the TDVs of one die before the next die is mounted. This is typically done in one conventional process by creating a reconstituted wafer of previously singulated dies and then performing the reveal process on the reconstituted wafer. Often times a gap filling process is necessary to avoid adversely affecting the lower dies in the stack during reveal of the TDVs of the current topmost die in the stack. However, the techniques disclosed herein enable the creation of die stacks where TDV reveals can always be performed at the wafer level without the need to resort to reconstitution. Gap filling processes during stack creation are not necessary.

In accordance with one aspect of the present invention, a method of manufacturing is provided that includes mounting a first semiconductor die on a second semiconductor die of a first semiconductor wafer. The second semiconductor die is singulated from the first semiconductor wafer to yield a first die stack. The second semiconductor die of the first die stack is mounted on a third semiconductor die of a second semiconductor wafer. The third semiconductor die is singulated from the second semiconductor wafer to yield a second die stack. The second die stack is mounted on a fourth semiconductor die of a third semiconductor wafer.

The method including mounting a first dummy component on the third semiconductor wafer adjacent a first side of the second die stack and a second dummy component on the third semiconductor wafer adjacent a second side of the second die stack opposite to the first side.

The method including singulating the fourth semiconductor die from the third semiconductor wafer to yield a third die stack.

The method including mounting the first semiconductor wafer to a first carrier wafer and revealing plural through-die-vias of the second semiconductor die prior to mounting the first semiconductor die on the second semiconductor die.

The method including mounting the second semiconductor wafer to a second carrier wafer and revealing plural through-die-vias of the third semiconductor die prior to mounting the second semiconductor die on the third semiconductor die.

The method including fabricating plural interconnects between the first semiconductor die and the second semiconductor die.

The method wherein the mounting the first semiconductor die to the second semiconductor die includes forming an insulating bonding layer having a first glass layer and a second glass layer between and bonding the first semiconductor die and the second semiconductor die and annealing to bond the first glass layer to the second glass layer and to metallurgically bond conductor structures of the first semiconductor die and conductor structures of the second semiconductor die.

The method including molding a molding material to at least partially encase the second die stack.

The method wherein the fourth semiconductor die has a first side facing the third semiconductor die and another side opposite the first side, and including fabricating plural I/Os on the another side.

In accordance with another aspect of the present invention, a method of manufacturing is provided that includes mounting a first semiconductor wafer on a first carrier wafer, revealing plural through-die-vias of a first semiconductor die of the first semiconductor wafer, mounting a second semiconductor die on the first semiconductor die after the revealing of the through-die-vias, singulating the first semiconductor die from the first semiconductor wafer to yield a first die stack, mounting a second semiconductor wafer on a second carrier wafer, revealing plural through-die-vias of a third semiconductor die of the second semiconductor wafer, mounting the first semiconductor die of the first die stack on the third semiconductor die after the revealing of the through-die-vias of the third semiconductor die, singulating the third semiconductor die from the second semiconductor wafer to yield a second die stack, and mounting the second die stack on a fourth semiconductor die of a third semiconductor wafer.

The method including mounting a first dummy component on the third semiconductor wafer adjacent a first side of the second die stack and a second dummy component on the third semiconductor wafer adjacent a second side of the second die stack opposite to the first side.

The method including singulating the fourth semiconductor die from the third semiconductor wafer to yield a third die stack.

The method including fabricating plural interconnects between each of the dies of the second die stack.

The method wherein the mounting the second semiconductor die to the first semiconductor die includes forming an insulating bonding layer having a first glass layer and a second glass layer between and bonding the first semiconductor die and the second semiconductor die and annealing to bond the first glass layer to the second glass layer.

The method including molding a molding material to at least partially encase the second die stack.

The method wherein the first semiconductor die has a first side facing the second semiconductor die and another side opposite the first side, including fabricating plural I/Os on the another side.

In accordance with another aspect of the present invention, a semiconductor die device is provided that includes a first semiconductor die, a stack of plural semiconductor dies positioned on the first semiconductor die, where each two adjacent semiconductor dies of the stack of plural semiconductor dies is electrically connected by plural interconnects, a first dummy component positioned opposite a first side of the stack of semiconductor dies and separated from the stack of plural semiconductor dies by a first gap and a second dummy component positioned opposite a second side of the stack of plural semiconductor dies and separated from the stack of plural semiconductor dies by a second gap, and a molding material positioned in the first and second gaps and at least partially encasing the stack of plural semiconductor dies.

The semiconductor die device wherein each two adjacent semiconductor dies of the stack of plural semiconductor dies is physically connected by an insulating bonding layer, the insulating bonding layer including a first insulating layer and a second insulating layer bonded to the first insulating layer.

The semiconductor die device wherein the interconnects comprises bumpless interconnects.

The semiconductor die device wherein the first semiconductor die has a first side facing a lowermost semiconductor die of the stack of plural semiconductor dies and another side opposite the first side, and plural I/Os on the another side.

In the drawings described below, reference numerals are generally repeated where identical elements appear in more than one figure. Turning now to the drawings, and in particular to FIG. 1 which is a sectional view of an exemplary semiconductor die device 10 that includes a stack 15 of multiple semiconductor dies mounted on another semiconductor die 20. The semiconductor die device 10 can be mounted on a circuit board (not shown), such as a package substrates, a system board, a daughter board, a circuit cards or other. The stack 15 in this illustrative arrangement consists of four semiconductor dies 25, 30, 35 and 40, but of course, other numbers are possible. The semiconductor dies 20, 25, 30, 35 and 40 include respective back end of line structures (BEOL) 45, 50, 55, 60 and 65. The BEOLs 45, 50, 55, 60 and 65 consist of strata of logic and other devices that make up the functionalities of the semiconductor dies 20, 25, 30, 35 and 40 as well as plural metallization and interlevel dielectric layers. The semiconductor dies 25, 30, 35 and 40 of the semiconductor die stack 15 can have different footprints or approximately the same footprint. In the illustrated arrangement, the semiconductor dies 25, 30, 35 and 40 of the semiconductor die stack 15 can have successively smaller footprints, that is, the semiconductor die 40 is smaller than the semiconductor die 35, which in-turn is smaller than the semiconductor die 30 and so on.

Electrical connections between the semiconductor die 25 and the semiconductor die 20 are by way of plural interconnects 70. The semiconductor die 30 is electrically connected to the semiconductor die 25 by way of plural interconnects 75. In addition, sets of interconnects 80 and 85 establish electrical conductivity between the semiconductor dies 35 and 30 and 40 and 35, respectively. Insulating layers 90, 95, 100 and 105 are positioned between the semiconductor die 25 and semiconductor die 20, the semiconductor die 30 and the semiconductor die 25, the semiconductor die 35 and the semiconductor die 30 and the semiconductor die 40 and the semiconductor die 35 respectively. The insulating layers 90, 95, 100 and 105 can be unitary or multiple layer structures as described in more detail below. The interconnects 70, 75, 80 and 85 can be hybrid bonds, conductive pillars, solder bumps, solder micro bumps or other types of interconnects.

The semiconductor dies 20, 25, 30, 35 and 40 can be any of a variety of integrated circuits. A non-exhaustive list of examples includes processors, such as microprocessors, graphics processing units, accelerated processing units that combine aspects of both, memory devices, an application integrated specific circuit or other. In one arrangement, the semiconductor die 20 can be a processor and the semiconductor dies 25, 30, 35 and 40 can be memory dies, such as DRAM, SRAM or other.

To facilitate heat transfer from the semiconductor die 20, dummy components 110 and 115 can be mounted on the semiconductor die 20 and secured thereto by way of adhesive layers 120 and 125, respectively. The dummy components 110 and 115 can be composed of silicon, germanium, or other type of semiconductor or even a dielectric material and serves as a heat transfer avenue for conducting heat away from the semiconductor die 20 and other components of the semiconductor die device 10. The adhesive layers 120 and 125 can be various types of organic adhesives, inorganic bonding layers, glass-based adhesives or even solder materials in other arrangements. A non-exhaustive list includes epoxies, an organic TIM, such as silicone rubber mixed with aluminum particles and zinc oxide. Compliant base materials other than silicone rubber and thermally conductive particles other than aluminum may be used. Thermal greases and gold, platinum and silver represent a few examples. In other arrangements the adhesive layers 120 and 125 can be nanofoils composed of layers of aluminum and nickel.

A molding material 130 at least laterally encases the semiconductor die stack 15 and is positioned between the semiconductor die stack 15 and the dummy components 110 and 115. In an exemplary arrangement the materials for the molding material 130 can have a molding temperature of about 165° C. Two commercial variants are Sumitomo EME-G750 and G760. Well-known compression molding techniques can be used to mold the molding material 130.

Through die electrical conductivity is provided by plural through-die-vias (TDV). For example, the semiconductor die 20 includes plural TDVs 135 that are connected to the interconnects 70 and to I/Os 140. The TDVs 135 (and any related disclosed conductors, such as pillars and pads) can be composed of various conductor materials, such as copper, aluminum, silver, gold, platinum, palladium or others. Typically, each TDV 135 is surrounded laterally by a liner layer (not shown) of SiOx or other insulator and a barrier layer of TiN or other barrier materials. The semiconductor die 25 similarly includes TDVs 145 that are connected between the interconnects 70 and 75. The semiconductor die 30 includes TDVs 150 that connect between the interconnects 75 and 80 and the semiconductor die 35 includes TDVs 155 that connect between the interconnects 80 and 85. Finally the semiconductor die 40 includes plural TDVs 160, which in this illustrative arrangement are not revealed, but of course could be revealed using the thinning/reveal processes disclosed herein to facilitate interconnection with yet another die stacked on top of the stack 15 if desired. The I/Os 140 enable the semiconductor die device 10 to interface electrically with another component such as a circuit board or other device, and can be solder bumps, balls or other types of interconnect structures. Well-known lead free solders, such as Sn—Ag, Sn—Ag—Cu or others can be used for the I/Os 140 and other solder structures disclosed herein.

Figure 2:
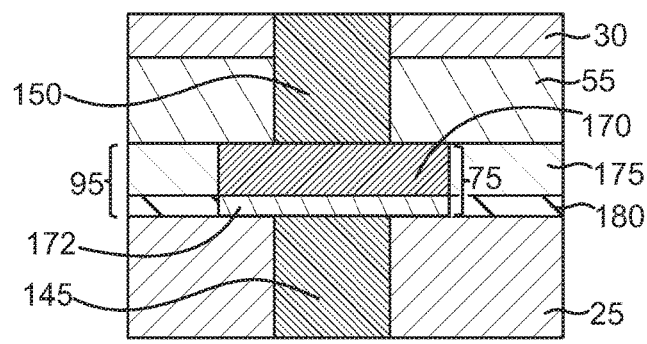
FIG. 2 is a portion of FIG. 1 shown at greater magnification.

Additional details of an exemplary arrangement of the interconnects 75 and insulating layer 95 will be described now in conjunction with FIG. 2. Note that FIG. 2 is the portion of FIG. 1 circumscribed by the small dashed rectangle 165 shown at greater magnification. The following description will be illustrative of the other interconnects 70, 80 and 85 and other insulating layers 90, 100 and 105 as well. As shown in FIG. 2, each of the interconnects 75 consists of a bumpless oxide hybrid bond. In this regard, the interconnect 75 between the semiconductor die 25 and the BEOL 55 is made up of a metallurgical bond between a bond pad 170 of the BEOL 55 and a bond pad 172 of the semiconductor die 25. The bond pad 170 is connected to the TDV 150 and the bond pad 172 is connected to the TDV 145. In addition, the insulating structure 95 joins the semiconductor die 25 to the semiconductor die 30 and consists of a glass layer 175, such as SiOx, of the semiconductor die 30 and another glass layer 180, such as silicon oxynitride, of the semiconductor die 25. The glass layers 175 and 180 are preferably deposited on the semiconductor dies 25 and 30, respectively, by plasma enhanced chemical vapor deposition (PECVD). The bond pad 170 is positioned in the glass layer 175 and the bond pad 172 is positioned in the glass layer 180. The bond pad 170 and the bond pad 172 are metallurgically bonded by way of an anneal process. In this regard, the semiconductor die 30 is brought down or otherwise positioned on the semiconductor die 25 so that the glass layer 175 is on or in very close proximity to the glass layer 180 and the bond pad 170 is on or in very close proximity to the bond pad 172. Thereafter, an anneal process is performed, which produces a transitory thermal expansion of the bond pads 170 and 172 bringing those structures into physical contact and causing them to form a metallurgical bond that persists even after the semiconductor dies 25 and 30 are cooled and the bond pads 170 and 172 contract thermally. Copper performs well in this metal bonding process, but other conductors could be used. There is also formed an oxide/oxynitride bond between the glass layer 175 and the glass layer 180. An exemplary anneal is performed at about 300° C. for about 30 to 60 minutes to form the requisite oxynitride-oxide bonds and metal-metal bonds. In another alternative, conductive pillars on each of two adjacent stacked dies can be thermal compression bonded. In another alternative arrangement, direction oxide bond and TSV last connection can be used. In this technique, facing sides of each two adjacent stacked dies each receive an oxide film. The oxide films are subsequently planarized using chemical mechanical polishing and then plasma treated to become hydrophillic. The oxide surfaces are next placed together and annealed to form a bond.

An exemplary process flow for fabricating the semiconductor die device 10 depicted in FIG. 1 will now be described in conjunction with FIGS. 3, 4, 5, 6, 7, 8, 9, 10, 11, 12, 13, 14, 15, 16, 17, 18, 19, 20, 21 and 22. Attention is initially turned to FIG. 3, which is a sectional view of a portion of a semiconductor wafer 185. The semiconductor wafer 185 can include scores or hundreds of individual semiconductor dies in addition to the semiconductor die 35. Here, the semiconductor die 35 is demarcated by dicing streets 190 and 195 where eventual singulation from the semiconductor wafer 185 will occur. Of course there are additional dicing streets that are not associated with the semiconductor die 35, which are not visible in FIG. 3. The wafer 185 has been processed to the point where the BEOL 60 of the semiconductor die 35 is complete along with the TDVs 155. However, the wafer 185 has yet to undergo a thinning process to reveal the TDVs 155.

Figure 3:
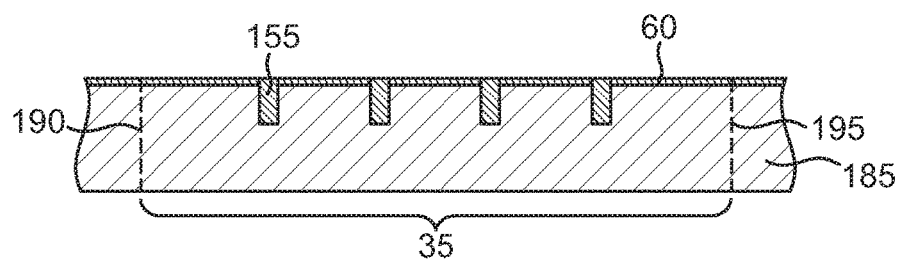
FIG. 3 is a sectional view of a portion of an exemplary semiconductor wafer.
Figure 4:
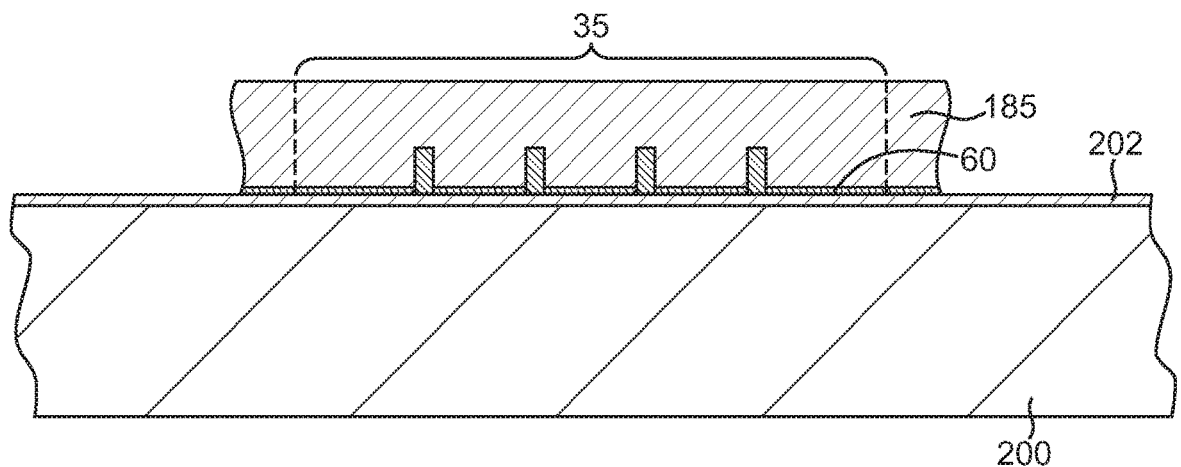
FIG. 4 is a sectional view depicting exemplary mounting of the semiconductor wafer on a carrier wafer.

Next and as shown in FIG. 4, the wafer 185 is flipped over from the orientation depicted in FIG. 3 and mounted on, and with the BEOL 60 facing towards, a carrier wafer 200. The carrier wafer 200 can be composed of silicon, various glasses, or other types of semiconductor materials. The wafer 185 can be secured to the carrier wafer 200 by way of an adhesive 202 applied to the carrier wafer 200. The adhesive 202 is preferably a well-known reversible adhesive, such as light activated or thermally activated adhesives, that can be reversed so that later the carrier wafer 200 can be removed. Optionally, bonding agents that require chemical and/or mechanical removal techniques could be used.

Figure 5:
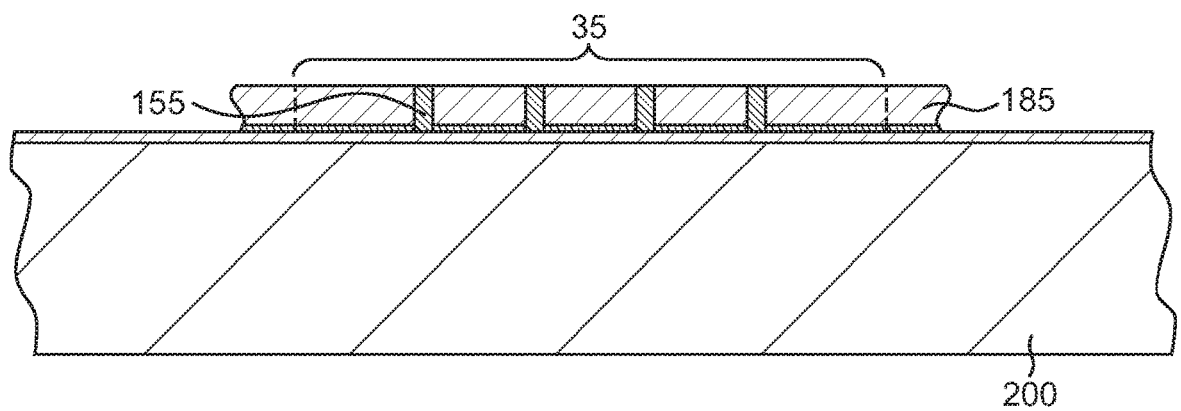
FIG. 5 is a sectional view depicting exemplary wafer thinning.

Next and as shown in FIG. 5, the wafer 185 undergoes a thinning process to reveal the TDVs 155. Various thinning/ reveal processes can be used. In one arrangement, the reveal process is preferably a soft reveal wherein the wafer 185 and the semiconductor die 35 are subjected to a grinding process to just above the tops of the through-die vias 155, followed by an etch back to reveal the tops of the through-die-vias 155. Next, a deposition process is used to establish a thin glass layer (not visible but like the glass layer 180 depicted in FIG. 2 and described above). The thin glass layer is preferably deposited using PECVD and then subjected to CMP. The carrier wafer 200 facilitates these various grinding, etching, deposition and CMP processes. In one so-called "hard reveal" technique, a grinding process is used to expose the TDVs 155 followed by an etch back of a small amount of the wafer 185 (silicon or otherwise), followed by a thin oxide growth or deposition or a thin silicon nitride deposition by CVD and again followed by a chemical mechanical planarization in order to finalize the through-die via reveal. The first technique avoids exposing the substrate semiconductor wafer 185 to loose copper or other metal particles that can be liberated during a hard reveal.

Figure 6:
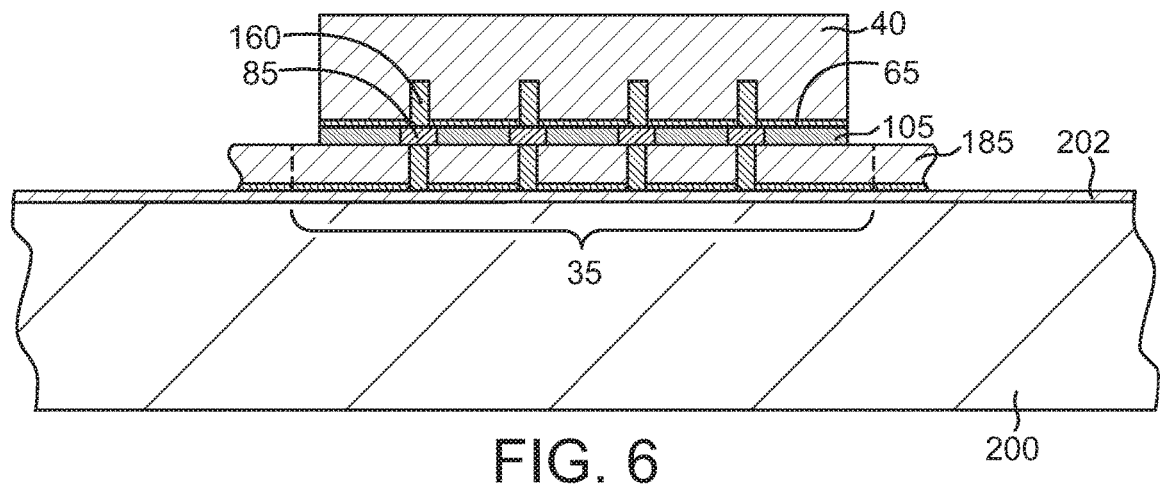
FIG. 6 is a sectional view depicting exemplary mounting of a semiconductor die on a semiconductor die of the semiconductor wafer.

Next and as shown in FIG. 6, the semiconductor die 40 is mounted on the semiconductor die 35 of the wafer 185. The semiconductor die 40 is a singulated device that was formally part of another semiconductor wafer (not shown) that was processed to establish the BEOL 65 of the semiconductor die 40 as well as the unexposed TDVs 160 thereof. The interconnects 85 and the insulating layer 105 are fabricated at this point using the techniques disclosed elsewhere herein in conjunction with FIG. 2 and for the interconnects 75 and the insulating layer 95. Of course if the aforementioned bumpless hybrid bond process described in conjunction with FIG. 2 is used, then the mounting process will be preceded by application of a glass layer (not visible but like the glass layer 175 depicted in FIG. 2 and described elsewhere herein) on the semiconductor die 40 (or the wafer of which it was formally a part). Optionally, if the interconnects 85 are solder bumps, solder micro bumps or other types of interconnects then an appropriate mounting and reflow process will be performed at this stage to establish the interconnects 85.

Figure 7:
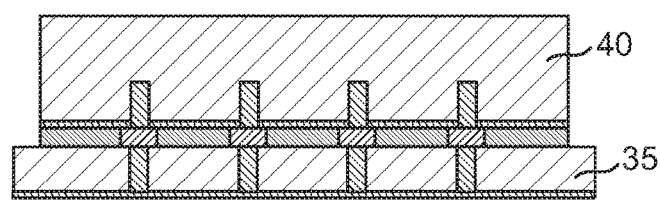
FIG. 7 is a sectional view of a singulated die stack.

Next and as shown in FIG. 7, the semiconductor die 35 is singulated from the wafer 185 following the initial removal of the carrier wafer 200 shown in FIG. 6 to yield the combination of the semiconductor dies 35 and 40. The removal process for the carrier wafer 200 will depend on the type of the adhesive 202. Examples include thermal release, chemical release, mechanical peel off or laser induced removal. This combination of semiconductor dies 35 and 40 is now a stackable element that will be placed on the semiconductor die 30 as described more fully below.

Figure 8:
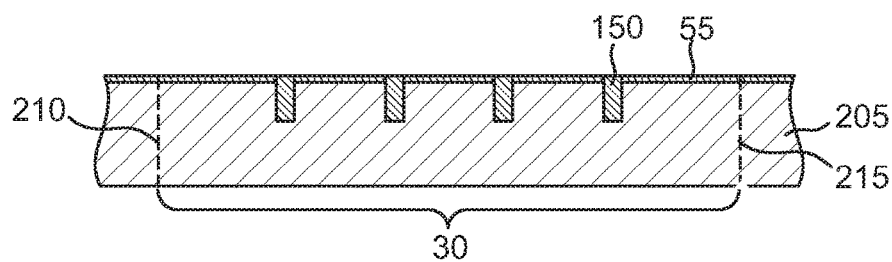
FIG. 8 is a sectional view of a portion of another exemplary semiconductor wafer.
Figure 9:
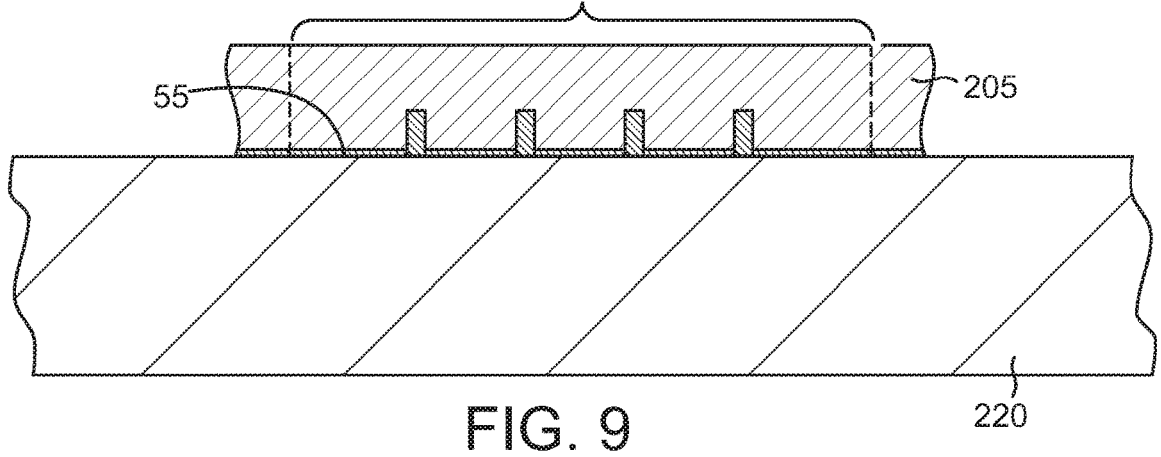
FIG. 9 is a sectional view depicting exemplary mounting of the semiconductor wafer on another carrier wafer.
Figure 10:
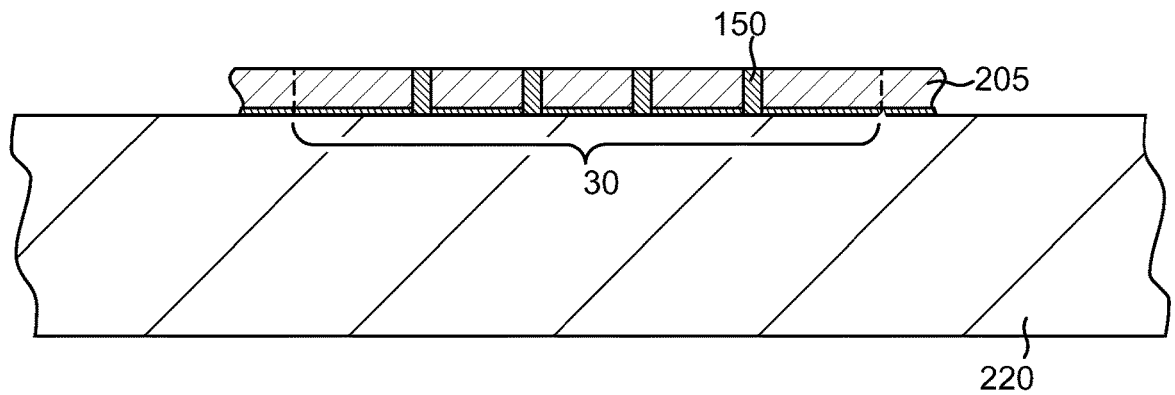
FIG. 10 is a sectional view depicting exemplary wafer thinning.
Figure 11:
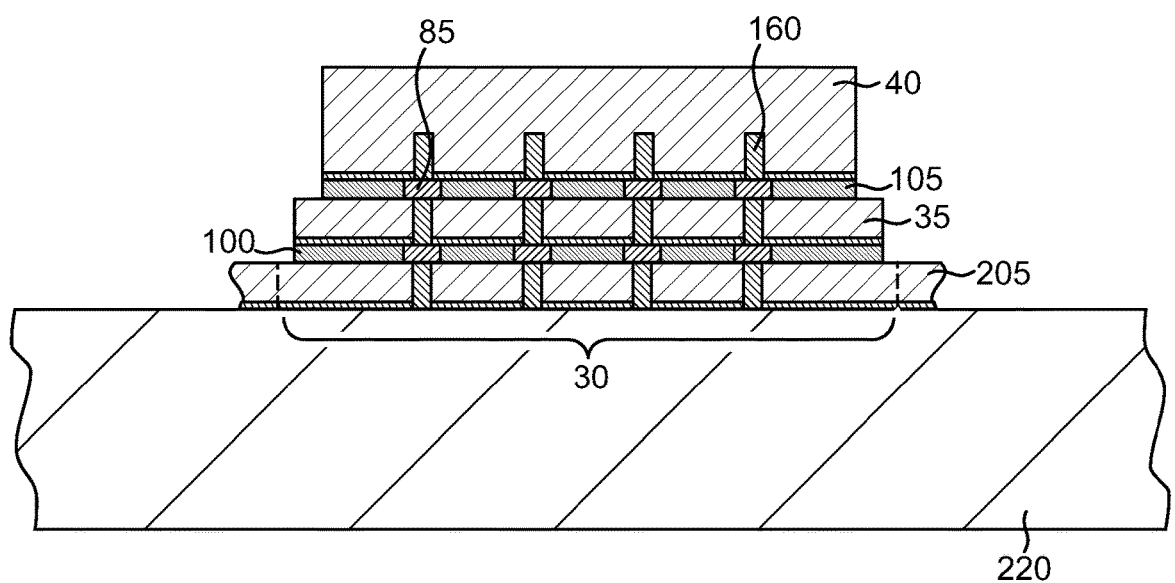
FIG. 11 is a sectional view depicting exemplary mounting of the die stack on a semiconductor die of the semiconductor wafer.
Figure 12:
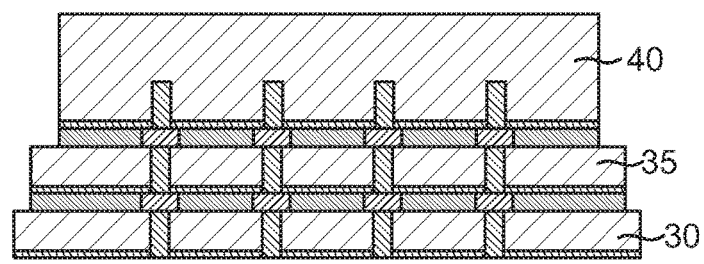
FIG. 12 is a sectional view of another singulated die stack.

The fabrication of the semiconductor die 30 will now be described in conjunction with FIGS. 8, 9 and 10. Another semiconductor wafer 205 includes multitudes of semiconductor dies including the semiconductor die 30 which has been processed using well known techniques to establish the BEOL 55 and the TDVs 150 thereof. Like the semiconductor wafer 185, the wafer 205 has not undergone a thinning process at this point to reveal the TDVs 150. The semiconductor die 30 is demarcated by dicing streets 210 and 215 and at least two others that are not visible in FIG. 8. Next and as shown in FIG. 9, the semiconductor wafer 205 is flipped over from the orientation shown in FIG. 8 and mounted on another carrier wafer 220 such that the BEOL 55 is facing towards the carrier wafer 220. The carrier wafer 220 can be composed of silicon, various glasses, or other types of semiconductor materials. The semiconductor wafer 205 can be secured to the carrier wafer 220 by way of an adhesive applied to the carrier wafer 220. The adhesive can be like the adhesive 202 described above, and is not shown for simplicity of illustration. Next and as shown in FIG. 10, the semiconductor wafer 205 undergoes a thinning process to reveal the TDVs 150 of the semiconductor die 30. The reveal can be by way of the thinning/reveal processes disclosed above in conjunction with FIG. 5. The wafer 205 is now ready to have the combination of the semiconductor dies 35 and 40 mounted onto the semiconductor die 30 thereof. Next and as shown in FIG. 11, the combination of the semiconductor dies 35 and 40 is mounted on the semiconductor die 30 of the wafer 205. The mounting process can be like the mounting process described above in conjunction with mounting the semiconductor die 40 on the semiconductor die 35. In this regard, the interconnects 80 and the insulating layer 100 are established at this point using the techniques described above in conjunction with the interconnects 75 and the insulating structure 95 depicted in FIGS. 1 and 2. The carrier wafer 220 is removed using a process suitable for the adhesive (not visible) that bonded to the semiconductor wafer 205, such as the types disclosed elsewhere herein. The semiconductor die 30 is then singulated from the wafer 205 to yield the singulated combination of the semiconductor dies 30, 35 and 40 as shown in FIG. 12. Singulation can be by mechanical sawing, laser cutting or other techniques.

Figure 13:
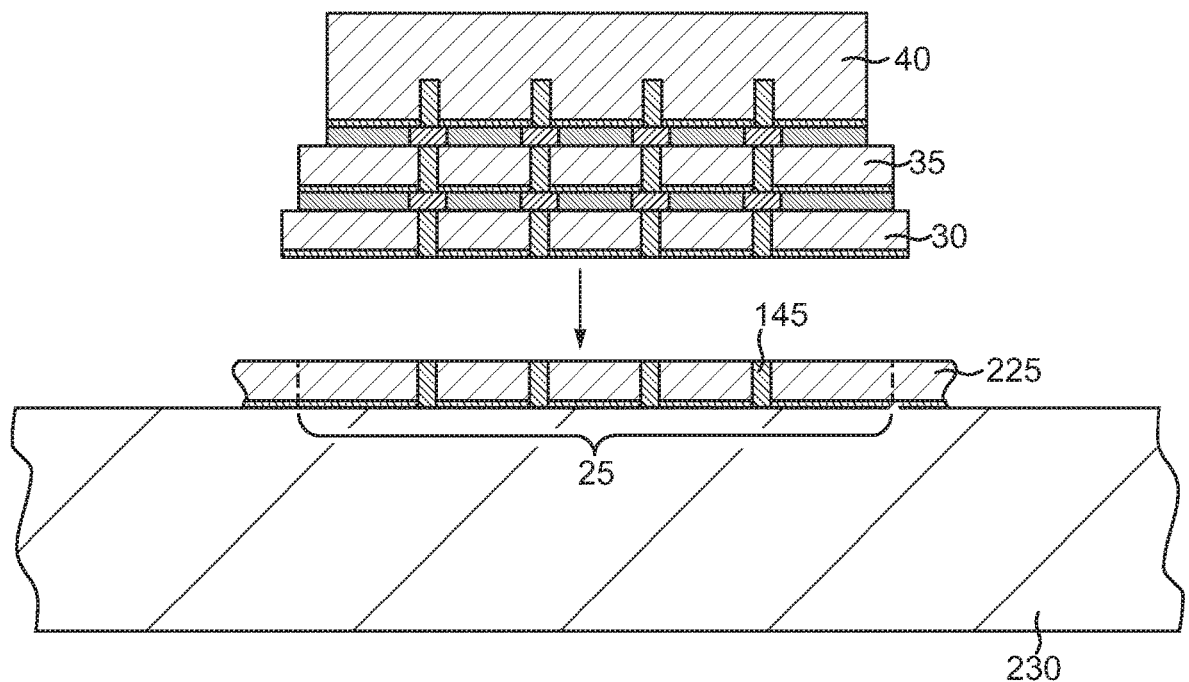
FIG. 13 is a sectional view depicting exemplary mounting of the die stack on a semiconductor die of the semiconductor wafer.
Figure 14:
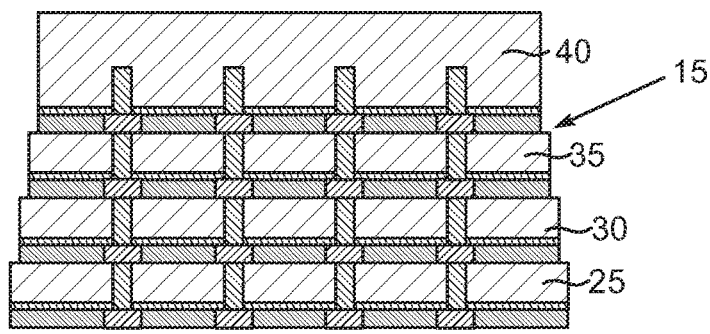
FIG. 14 is a sectional view of a singulated die stack.

Next and as shown in FIG. 13, the combination of the semiconductor dies 30, 35 and 40 is mounted on the semiconductor die 25, which is at this stage still part of a semiconductor wafer 225 that has been processed like the semiconductor wafers 185 and 205 described above on a carrier wafer 230 such that the wafer 225 has undergone a thinning process to reveal the TDVs 145 of the semiconductor die 25 and the BEOL 50 is facing towards the carrier wafer 230. The mounting process for the semiconductor dies 30, 35 and 40 to the semiconductor die 25 is like the process to mount the combination of the semiconductor dies 35 and 40 to the semiconductor die 30 just described. Following the mounting process, the carrier wafer 230 is removed and the semiconductor die 25 singulated from the semiconductor wafer 225 to yield the completed semiconductor die stack 15 shown in FIG. 14. The semiconductor die stack 15 consisting of the semiconductor dies 25, 30, 35 and 40 is now ready to be mounted on the semiconductor die 20 shown in FIG. 1.

Figure 15:
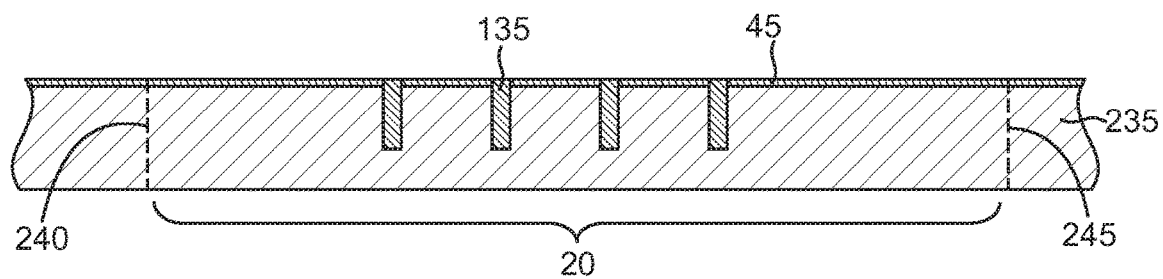
FIG. 15 is a sectional view of a portion of another exemplary semiconductor wafer.
Figure 16:
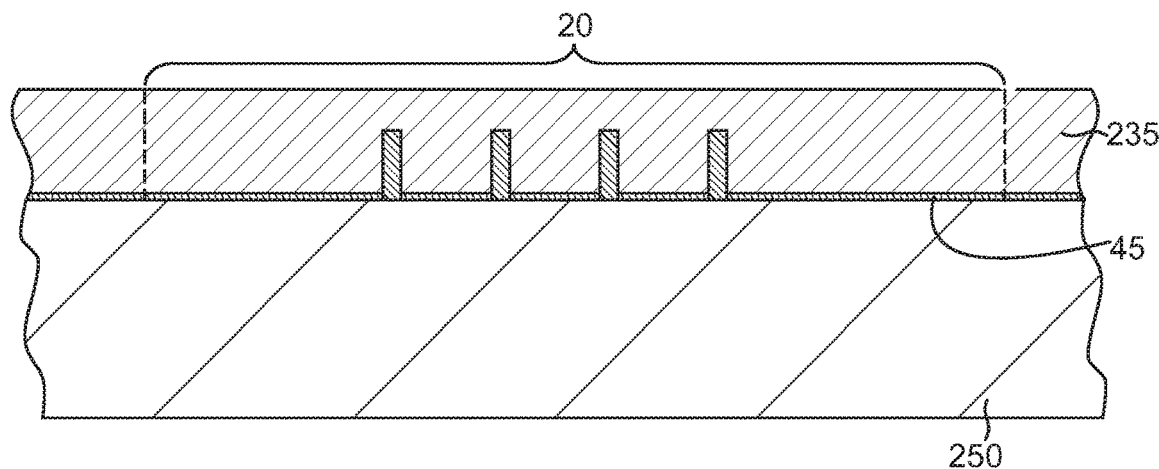
FIG. 16 is a sectional view depicting exemplary mounting of the semiconductor wafer on another carrier wafer.
Figure 17:
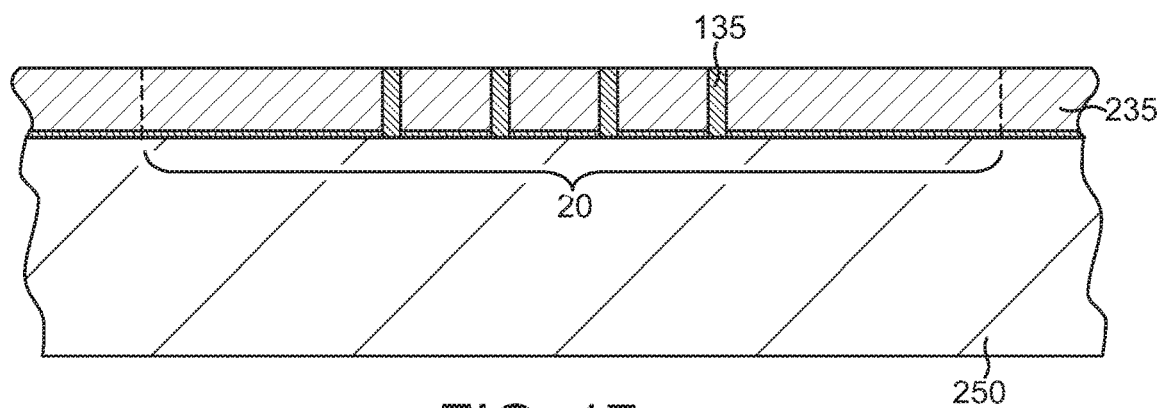
FIG. 17 is a sectional view depicting exemplary wafer thinning.
Figure 18:
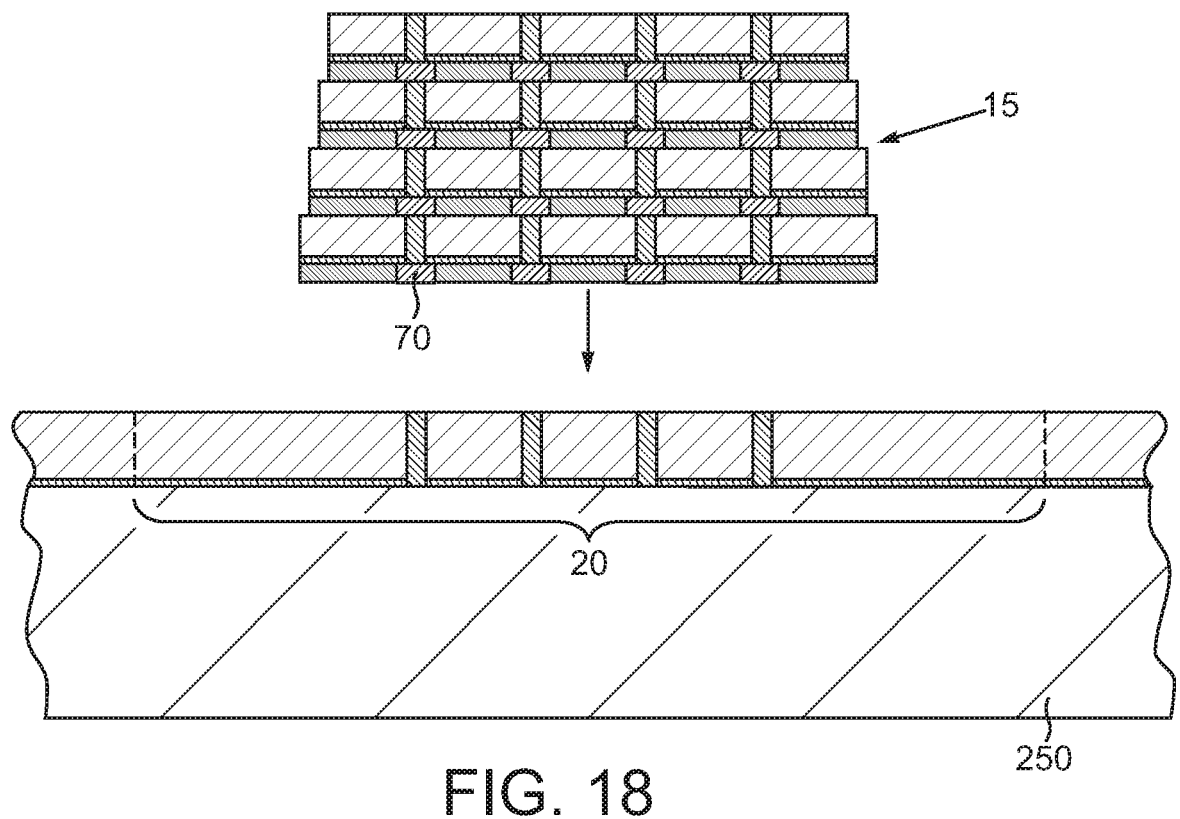
FIG. 18 is a sectional view depicting exemplary mounting of the die stack on a semiconductor die of the semiconductor wafer.
Figure 19:
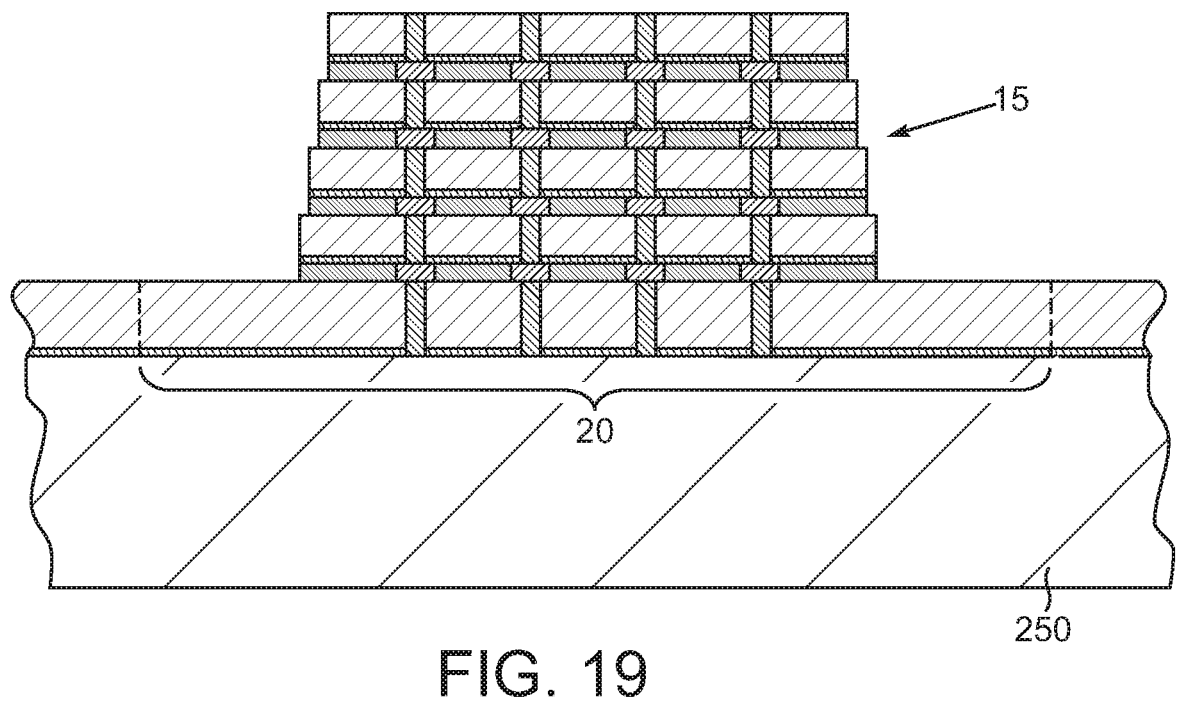
FIG. 19 is a sectional view depicting the mounted die stack on a die of the semiconductor wafer.
Figure 20:
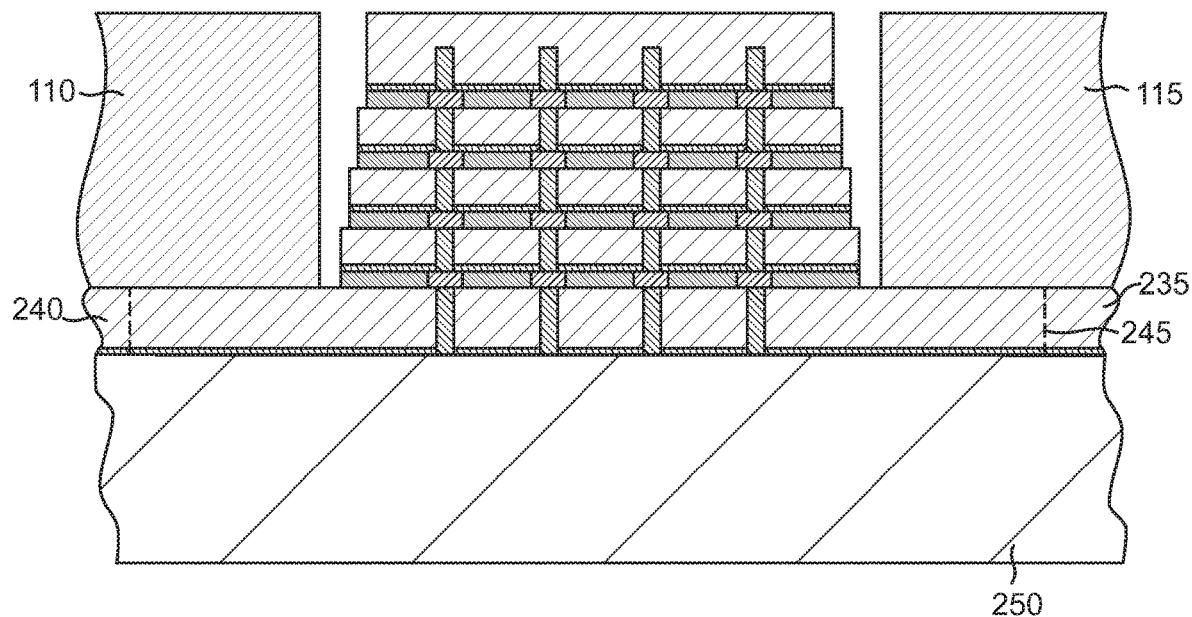
FIG. 20 is a sectional view depicting exemplary dummy component mounting.

Referring now to FIG. 15, the semiconductor die 20 is initially part of a semiconductor wafer 235 and is demarcated by dicing streets 240 and 245 as well as two other such streets (not visible). The wafer 235 has been processed such that the BEOL 45 of the semiconductor die 20 and the TDVs 135 have been fabricated. However, the wafer 235 is yet to undergo a thinning process to reveal the TDVs 135. Next and as shown in FIG. 16, the semiconductor wafer 235 is flipped over from the orientation in FIG. 15 and mounted on a carrier wafer 250 with the BEOL 45 facing towards the carrier wafer 250. The semiconductor wafer 235 can be secured to the carrier wafer 250 using an adhesive applied to the carrier wafer 250. The adhesive can be like the adhesive 202 described above, and is not shown for simplicity of illustration. Next and as shown in FIG. 17, with the carrier wafer 250 in place, the wafer 235 undergoes a thinning process to reveal the TDVs 135 of the semiconductor die 20. The reveal can be by way of the thinning/reveal processes disclosed above in conjunction with FIG. 5. Next and as shown in FIG. 18, the semiconductor die stack 15 is mounted on the semiconductor die 20 of the wafer 235. This mounting process establishes the interconnects 70 and the insulating structure 90 and can be by way of the aforementioned hybrid bonding process or another process if the interconnect 70 are not hybrid bonds. The mounted stack 15 is depicted on the semiconductor die 20 in FIG. 19. Next and as shown in FIG. 20, with the carrier wafer 250 still in place, the dummy components 110 and 115 are mounted on the semiconductor wafer 235 on either side of the semiconductor die stack 15. The dummy components 110 and 115 could be preformed to be mounted and dedicated specifically to the semiconductor die stack 15. However, efficiencies can be achieved if the dummy components 110 and 115 are large enough to be sub-divided into dummy components that are set aside for the semiconductor die stack 15 and other dummy components (not visible) that will be used by adjacent semiconductor die stacks (not visible) on the semiconductor wafer 235. Indeed, note that during a subsequent singulation process, the dicing streets 240 and 245 will demarcate the post singulation lateral edges of the dummy components 110 and 115.

Figure 21:
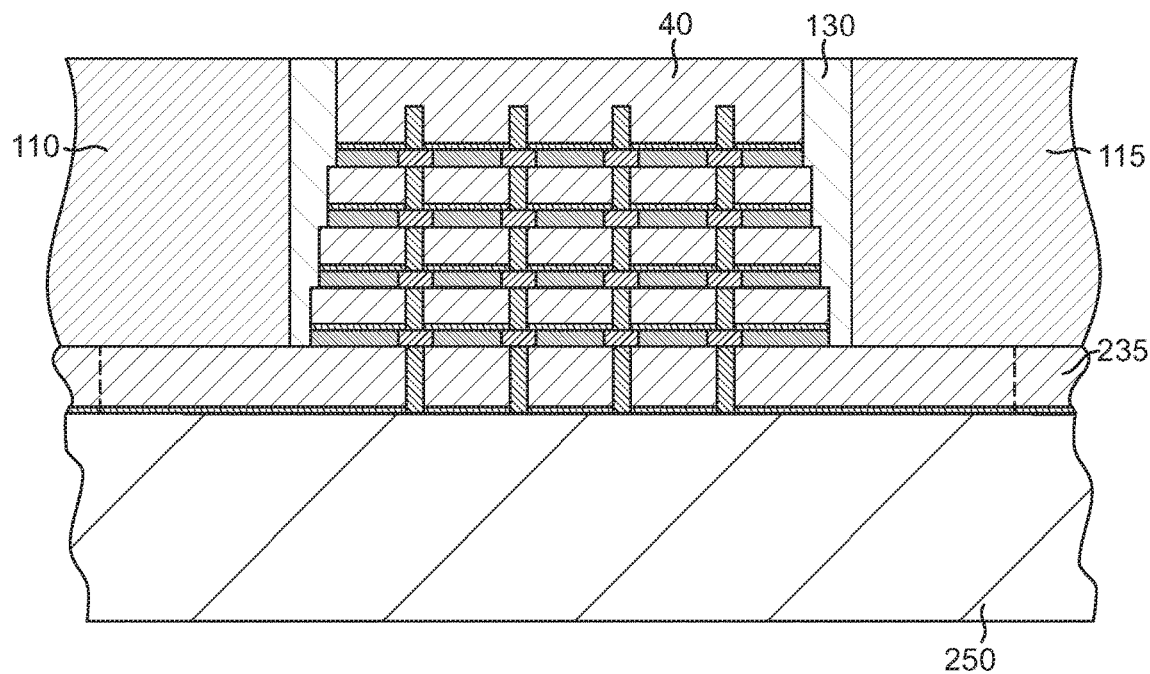
FIG. 21 is a sectional view depicting exemplary molding material molding.
Figure 22:
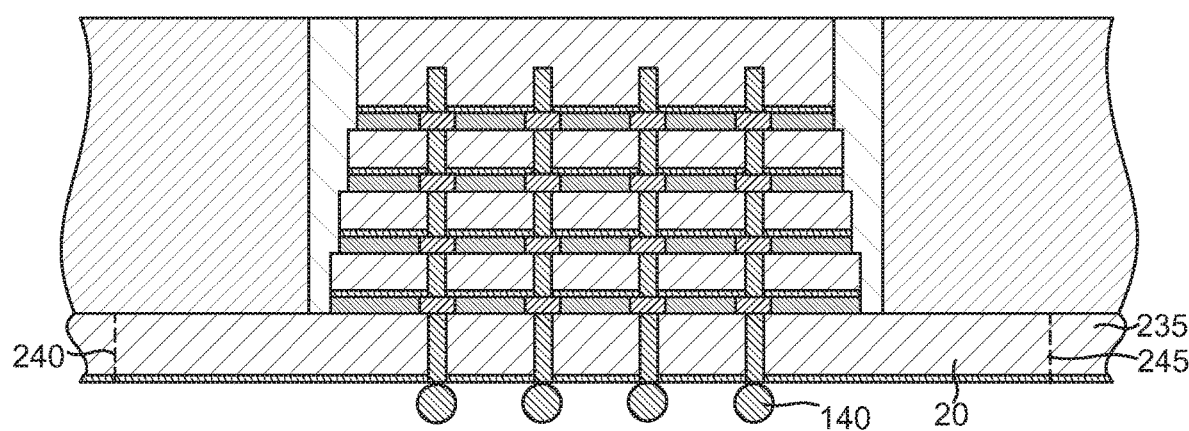
FIG. 22 is a sectional view depicting exemplary I/O mounting.

Next and as shown in FIG. 21, with the carrier wafer 250 in place, the semiconductor wafer 235 undergoes a molding process to establish the molding material 130. This molding process can establish the molding material 130 with an upper surface that is planar with the dummy components 110 and 115. Optionally, the molding material 130 can cover the dummy components 110 and 115 and even the top most semiconductor die 40 of the semiconductor die stack 15 and then a subsequent grinding process can be used to planarize the molding material 130 and the dummy components 110 and 115. Next and as shown in FIG. 22, the I/O structures 140 are fabricated or otherwise attached to the semiconductor die 20. This can entail a pick and place and reflow or a solder stencil or other process to establish the I/O structures 140. Prior to attaching or otherwise fabricating the I/O structures 140, the carrier wafer 250 depicted in FIG. 21 is removed using the carrier wafer removal techniques disclosed elsewhere herein. The semiconductor die 20 is next singulated using the techniques disclosed elsewhere herein from the semiconductor wafer 235 at the dicing streets 240 and 245 to yield the completed semiconductor die device 10 shown in FIG. 1.

While the invention may be susceptible to various modifications and alternative forms, specific embodiments have been shown by way of example in the drawings and have been described in detail herein. However, it should be understood that the invention is not intended to be limited to the particular forms disclosed. Rather, the invention is to cover all modifications, equivalents and alternatives falling within the spirit and scope of the invention as defined by the following appended claims.

What is claimed is:

1. A method of manufacturing, comprising:
   mounting a first semiconductor die on a second semiconductor die of a first semiconductor wafer, the mounting of the first semiconductor die on the second semiconductor die including forming a first insulating bonding layer having a first glass layer and a second glass layer between and bonding the first semiconductor die and the second semiconductor die and annealing to bond the first glass layer to the second glass layer and to metallurgically bond conductor structures of the first semiconductor die and conductor structures of the second semiconductor die;
   singulating the second semiconductor die from the first semiconductor wafer to yield a first die stack;
   mounting the second semiconductor die of the first die stack on a third semiconductor die of a second semiconductor wafer;
   singulating the third semiconductor die from the second semiconductor wafer to yield a second die stack; and
   mounting the second die stack on a fourth semiconductor die of a third semiconductor wafer.

2. The method of claim 1, comprising mounting a first dummy component on the third semiconductor wafer adjacent a first side of the second die stack and a second dummy component on the third semiconductor wafer adjacent a second side of the second die stack opposite to the first side.

3. The method of claim 1, comprising singulating the fourth semiconductor die from the third semiconductor wafer to yield a third die stack.

4. The method of claim 1, comprising mounting the first semiconductor wafer to a first carrier wafer and revealing plural through-die-vias of the second semiconductor die prior to mounting the first semiconductor die on the second semiconductor die.

5. The method of claim 4, comprising mounting the second semiconductor wafer to a second carrier wafer and revealing plural through-die-vias of the third semiconductor die prior to mounting the second semiconductor die on the third semiconductor die.

6. The method of claim 1, wherein the bonding of the conductor structures of the first semiconductor die and conductor structures of the second semiconductor die establish plural interconnects between the first semiconductor die and the second semiconductor die.

7. The method of claim 1, wherein the mounting the second semiconductor die of the first die stack on the third second semiconductor die comprises forming a second insulating bonding layer having a first glass layer and a second glass layer between and bonding the second semiconductor die and the third semiconductor die and annealing to bond the first glass layer to the second glass layer and to metallurgically bond conductor structures of the second semiconductor die and conductor structures of the third semiconductor die.

8. The method of claim 1, comprising molding a molding material to at least partially encase the second die stack.

9. The method of claim 1, wherein the fourth semiconductor die has a first side facing the third semiconductor die and another side opposite the first side, comprising fabricating plural I/Os on the another side.

10. The method of claim 1, comprising a molding material to at least partially encase the first die stack and the second die stack.

11. The method of claim 1, wherein one or more of the first semiconductor die, the second semiconductor die and the third semiconductor die comprises a memory die and the fourth semiconductor die comprises a processor.

12. The method of claim 1, wherein the first semiconductor die, the second semiconductor die, the third semiconductor die and the fourth semiconductor die have the same footprint.

13. The method of claim 1, wherein the first semiconductor die, the second semiconductor die, the third semiconductor die and the fourth semiconductor die have successively smaller footprints.

14. The method of claim 1, wherein the first glass layer comprises silicon oxide and the second glass layer comprises silicon oxynitride.

15. The method of claim 2, wherein the dummy components comprise a semiconductor or a dielectric.

16. The method of claim 3, comprising mounting the third die stack on a fifth semiconductor die.

17. The method of claim 16, comprising molding a molding material to at least partially encase the first die stack, the second die stack and the third die stack.

18. A method of manufacturing, comprising:
mounting a first semiconductor die on a second semiconductor die of a first semiconductor wafer, the mounting of the first semiconductor die on the second semiconductor die including forming a first insulating bonding layer having a first glass layer and a second glass layer between and bonding the first semiconductor die and the second semiconductor die and annealing to bond the first glass layer to the second glass layer and to metallurgically bond conductor structures of the first semiconductor die and conductor structures of the second semiconductor die;
singulating the second semiconductor die from the first semiconductor wafer to yield a first die stack;
mounting the second semiconductor die of the first die stack on a third semiconductor die of a second semiconductor wafer, the mounting of the second semiconductor die on the third semiconductor die including forming a second insulating bonding layer having a first glass layer and a second glass layer between and bonding the first semiconductor die and the second semiconductor die and annealing to bond the first glass layer to the second glass layer and to metallurgically bond conductor structures of the second semiconductor die and conductor structures of the third semiconductor die;
singulating the third semiconductor die from the second semiconductor wafer to yield a second die stack; and
mounting the third semiconductor die of the second die stack on a fourth semiconductor die of a third semiconductor wafer, the mounting of the third semiconductor die on the fourth semiconductor die including forming a third insulating bonding layer having a first glass layer and a second glass layer between and bonding the first semiconductor die and the second semiconductor die and annealing to bond the first glass layer to the second glass layer and to metallurgically bond conductor structures of the third semiconductor die and conductor structures of the fourth semiconductor die.

19. The method of claim 18, comprising mounting the fourth semiconductor die of the third die stack on a fifth semiconductor die, the mounting of the fourth semiconductor die on the fifth semiconductor die including forming a fourth insulating bonding layer having a first glass layer and a second glass layer between and bonding the fourth semiconductor die and the fifth semiconductor die and annealing to bond the first glass layer to the second glass layer and to metallurgically bond conductor structures of the fourth semiconductor die and conductor structures of the fifth semiconductor die.

20. The method of claim 18, comprising mounting a first dummy component on the third semiconductor wafer adjacent a first side of the second die stack and a second dummy component on the third semiconductor wafer adjacent a second side of the second die stack opposite to the first side.

21. A method of manufacturing, comprising:
mounting a first semiconductor die on a second semiconductor die of a first semiconductor wafer without leaving a gap between the first semiconductor die and the second semiconductor die;
singulating the second semiconductor die from the first semiconductor wafer to yield a first die stack;
mounting the second semiconductor die of the first die stack on a third semiconductor die of a second semiconductor wafer without leaving a gap between the second semiconductor die and the third semiconductor die;
singulating the third semiconductor die from the second semiconductor wafer to yield a second die stack; and
mounting the third semiconductor die of the second die stack on a fourth semiconductor die of a third semiconductor wafer without leaving a gap between the third semiconductor die and the fourth semiconductor die.

* * * * *